United States Patent [19]
Miyata et al.

[11] Patent Number: 5,288,729
[45] Date of Patent: Feb. 22, 1994

[54] EXPOSING METHOD AND APPARATUS

[75] Inventors: Yukitaka Miyata, Yokohama; Tatsuhiko Asaka, Tokyo; Hisashi Iijima, Oomiya; Shigeru Suwa, Kanuma, all of Japan

[73] Assignee: Kabushiki Kaisha Toshiba, Kawasaki, Japan

[21] Appl. No.: 813,060

[22] Filed: Dec. 23, 1991

Related U.S. Application Data

[63] Continuation of Ser. No. 593,895, Oct. 5, 1990, abandoned.

[30] Foreign Application Priority Data

Oct. 7, 1989 [JP] Japan ................................ 1-262800
May 9, 1990 [JP] Japan ................................ 2-119334

[51] Int. Cl.$^5$ ................................................ G03F 9/00
[52] U.S. Cl. .......................................... 430/22; 430/5; 430/394; 430/396; 356/374; 356/399; 356/401
[58] Field of Search .................. 430/5, 22, 394, 396; 356/374, 399, 401

[56] References Cited

U.S. PATENT DOCUMENTS

| | | | |
|---|---|---|---|
| 3,689,162 | 9/1972 | Ferguson | 356/374 |
| 4,448,522 | 5/1984 | Raush | 355/78 |
| 4,623,608 | 11/1986 | Andrevski | 430/22 |
| 4,656,107 | 4/1987 | Moscony et al. | 430/5 |
| 4,835,078 | 5/1989 | Harvey et al. | 430/22 |

FOREIGN PATENT DOCUMENTS

| | | |
|---|---|---|
| 2360686 | 3/1978 | France . |
| 62-211657 | 9/1987 | Japan . |
| 63-285842 | 11/1988 | Japan . |

Primary Examiner—Marion E. McCamish
Assistant Examiner—Kathleen Duda
Attorney, Agent, or Firm—Cushman, Darby & Cushman

[57] ABSTRACT

A method of exposing an object from both sides thereof, wherein the object has photosensitive material coated on both sides thereof and it is held between a first mask plate provided with a first masking pattern and a second mask plate provided with a second masking pattern. This exposing method comprises simultaneously image-sensing first and second alignment patterns formed at those areas on the inner sides of the first and second mask plates where the object is not held by the first and second mask plates so as to obtain an image signal, the first and second alignment patterns being in a predetermined positional relation when the first and second mask plates are correctly aligned with each other, processing the image signal to determine the positionally misregistered amount of the first and second alignment patterns from the predetermined positional relation, and moving one of the first and second mask plate in the facial direction thereof on the basis of the positionally misregistered amount of the alignment pattern thus determined to return the first and second alignment patterns to the predetermined positional relation.

4 Claims, 6 Drawing Sheets

EXPOSING METHOD AND APPARATUS

This is a continuation of application Ser. No. 07/593,895, filed on Oct. 5, 1990, which was abandoned upon the filing hereof Dec. 23, 1991.

BACKGROUND OF THE INVENTION

1 Field of the Invention

The present invention relates to an exposing apparatus and more particularly, it relates to an exposing apparatus used in the course of manufacturing shadow masks for color picture tubes.

2 Description of the Related Art

It is needed in the course of manufacturing shadow masks for color picture tubes that an iron plate 1 is selectively etched by acid on both sides thereof to accurately form a plurality of apertures 2 which pass through the iron plate 1, as shown in FIG. 1.

These apertures 2 are formed as follows. As shown in FIG. 2, photosensitive material is coated on both sides of the iron plate 1, which is then closely held between a first glass mask plate 6 on the inner side of which a large aperture pattern 4 is drawn and a second glass mask plate 7 on the inner side of which small aperture pattern 5 is drawn. Both sides of the iron plate 1 is irradiated by ultraviolet rays shot from a mercury-vapor lamp through the glass mask plates 6 and 7 to expose the photosensitive material on both sides of the iron plate 1. The photosensitive material on both sides of the iron plate 1 is developed, that is, that portion of the photosensitive material which is not exposed is removed from both sides of the iron plate 1 to form etching resistive patterns thereon. Using these etching resistive patterns as masks, the iron plate 1 is etched by acid to form a plurality of apertures 2 which pass through the iron plate 1.

When the large aperture pattern 4 is shifted from the small aperture pattern 5 upon the exposing step in the above-described process, the apertures, which are formed by etching the iron plate 1 with acid using the aperture patterns 4, 5 as etching masks, cannot have their predetermined shapes and sizes, or they cannot be passed through the iron plate 1 in the worst case.

In order to prevent this, the two glass mask plates 6 and 7 were opposed to each other without interposing the iron plate 1 between them to find by eyes whether or not they were aligned with each other. When they were not aligned with each other, one of them was moved to become aligned with the other.

However, this method of aligning the glass mask plates 6 and 7 with each other had the following problems.

In the case of the exposing apparatus used to make shadow masks for color picture tubes, the long iron plate 1 wound round drums 8 and fed, as shown in FIGS. 3 and 4, is repeatedly exposed in the manner as shown in a flow chart in FIG. 5. When the iron plate 1 is once interposed between the glass mask plates 6 and 7, therefore, it cannot be found by eyes whether or not the positional shift of one glass mask plate relative to the other is caused.

Further, the exposing step is repeated about 700 times in one or two days to expose all of the iron plate 1 wound round the drums 8. When the iron plate 1 is once interposed between the glass mask plates 6 and 7, therefore, the positional shift cannot be confirmed by eyes on the way of the course of repeating the exposing step even if this positional shift of one glass mask plate relative to the other is caused. This may lead to plenty of inferior products.

SUMMARY OF THE INVENTION

An object of the present invention is therefore to provide an exposing method capable of detecting the positional shift of a mask plate relative to another mask plate between which an object to be exposed, having photosensitive material coated on both sides thereof, is interposed, and easily correcting the position of one mask plate relative to the other in accordance with this positional shift detected.

Another object of the present invention is to provide an exposing apparatus capable of detecting the positional shift of a mask plate relative to another mask plate between which an object to be exposed, having photosensitive material coated on both sides thereof is interposed, and easily correcting the position of one mask plate relative to the other in accordance with this positional shift detected.

According to the present invention, there is provided an exposing method of exposing an object from both sides thereof through first and second mask plates between which the object is held, said object having photosensitive material coated on both sides thereof, said first mask plate having a first masking pattern on its inner side and said second mask plate having a second masking pattern on its inner side, comprising simultaneously image-sensing first and second alignment patterns formed at those areas on the inner sides of the first and second mask plates where the object interposed between the first and the second mask plate is not held so as to create an image signal, said first and second alignment patters being in a predetermined positional relation when the first and second mask plates are aligned with each other; processing the image signal to determine the misregistered amount of the first and second alignment pattern from the predetermined positional relation; and moving one of the first and second mask plates relative to the other in the facial direction thereof to put the first and second alignment patterns in the predetermined positional relation.

Further, there is provided an apparatus for exposing an object from both sides thereof, wherein said object has photosensitive material coated on both sides thereof and it is held between a first mask plate provided with a first masking pattern on the inner side thereof and a second mask plate provided with a second masking pattern on the inner side thereof, comprising: means for simultaneously image-sensing first and second alignment patterns formed at those areas on the inner sides of the first and second mask plates where the object is not held by the first and second mask plates so as to obtain an image signal, said first and second alignment patterns being in a predetermined positional relation when said first and second mask plates are correctly aligned with each other; means for processing the image signal to determine the positionally misregistered amount of the first and second alignment patterns from the predetermined positional relation; and means for moving one of the first and second mask plates relative to the other in the facial direction thereof on the basis of the positionally misregistered amount of the alignment pattern thus determined to correct the position of it to the predetermined positional relation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Some embodiments of the present invention will be described in detail referring to the accompanying drawings.

Figure 1:
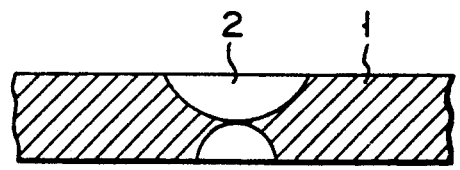
FIG. 1 is a sectional view showing a part of the shadow mask for the color picture tube.
Figure 6:
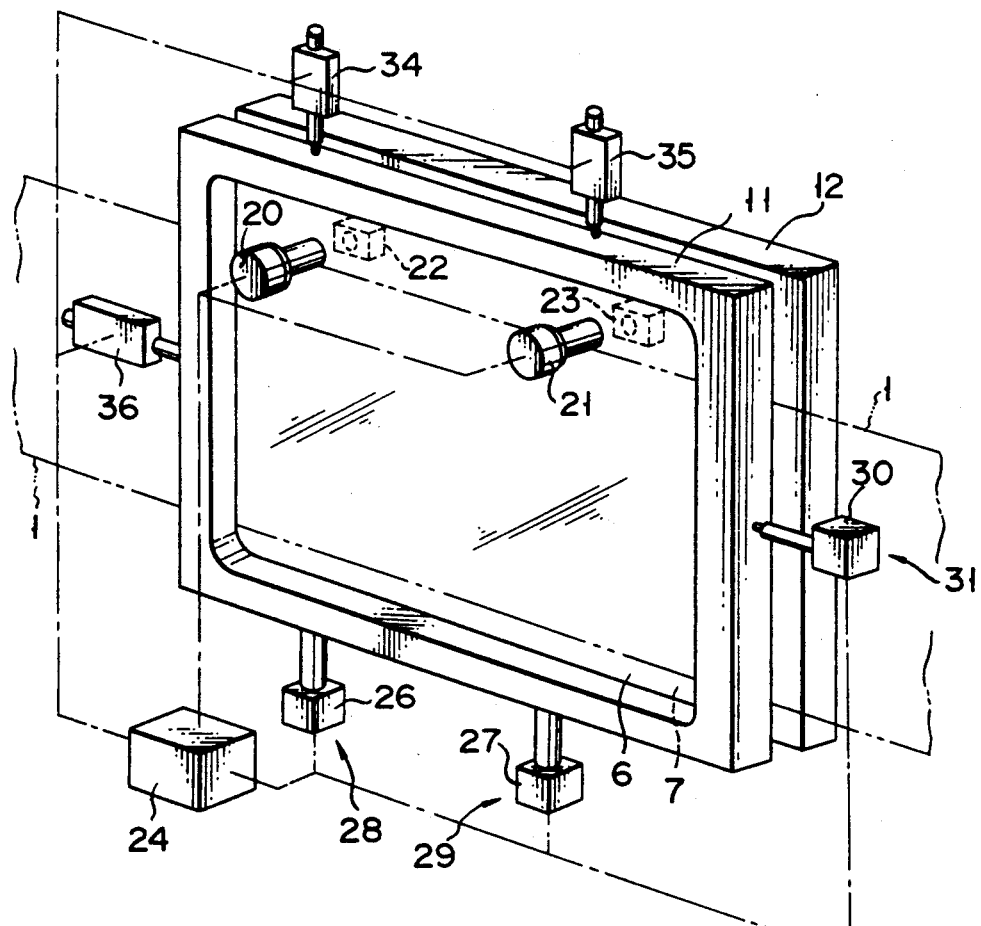
FIG. 6 is a perspective view showing an example of the exposing apparatus according to the present invention.

FIG. 6 shows an example of the exposing apparatus according to the present invention. The exposing apparatus shown in FIG. 6 is used to make the shadow masks for the color picture tubes shown in FIG. 1. The shadow mask is an iron plate 1 provided with a plurality of apertures 2.

Figure 2:
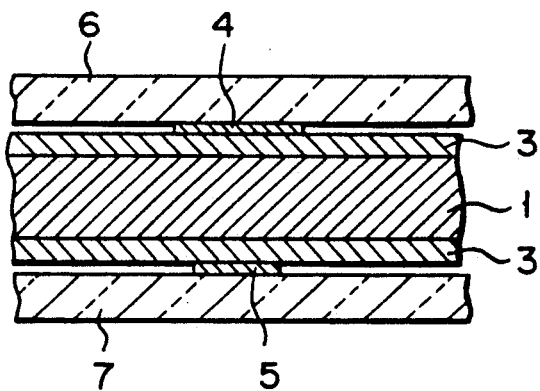
FIG. 2 is a sectional view showing an exposed plate between two mask plates exposed.
Figure 3:
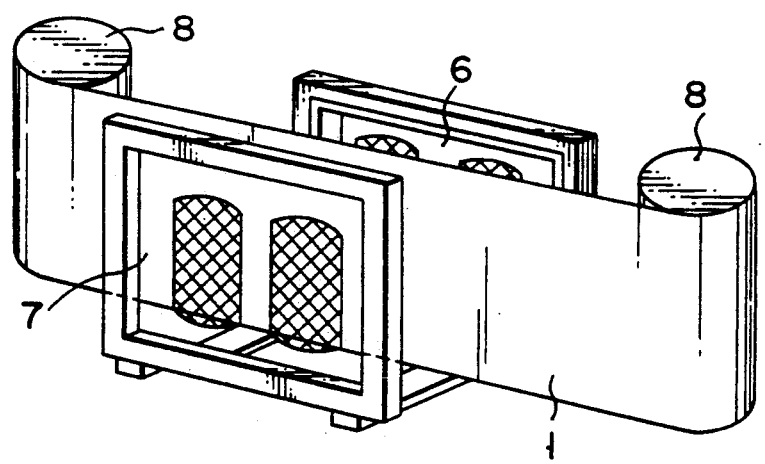
FIGS. 3 and 4 are perspective views showing the conventional exposing apparatus.
Figure 4:
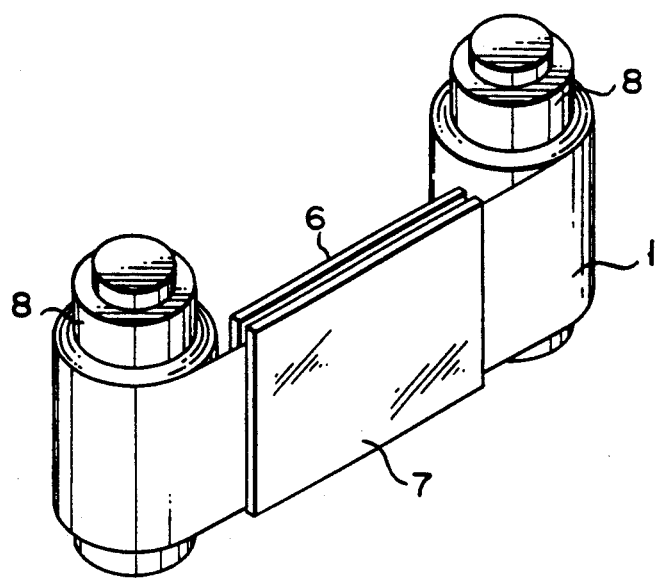

As shown in FIG. 2, the iron plate 1 having photosensitive material layers 3 coated on both surfaces thereof is closely held between a first glass mask plate 6 on the inner face of which a large aperture pattern 4 is drawn and a second glass mask plate 7 on the inner face of which a small aperture pattern 5 is drawn. Ultraviolet rays are irradiated from mercury-vapor lamps to both surfaces of the iron plate 1 to expose the photosensitive material layers 3 thereon and the photosensitive material layers 3 at those areas on both surface of the iron plate 1 where the photosensitive material layers 3 are not exposed are removed from both surfaces of the iron plate 1 to form etching resistive patterns thereon. Using the etching resistive patterns as masks, the iron plate 1 is etched by acid to form a plurality of apertures 2 which pass through the iron plate 1.

In FIG. 6, the first and second glass mask plates 6 and 7 are held in rectangular frames 11 and 12, respectively, and the long iron plate 1 moves between these glass mask plates 6 and 7. The rectangular frames 11 and 12 can be opened and closed in the opposed direction. In other words, they can be separated from each other and come close to each other. When they are closed, the glass mask plates 6 and 7 are contacted with both surfaces of the iron plate 1 to hold the iron plate 1 between them. When the space between the glass mask plates 6 and 7 is made vacuum, the glass mask plates 6 and 7 can be closely contacted with the photosensitive material layers 3 on both surfaces of the iron plate 1.

Figure 7:
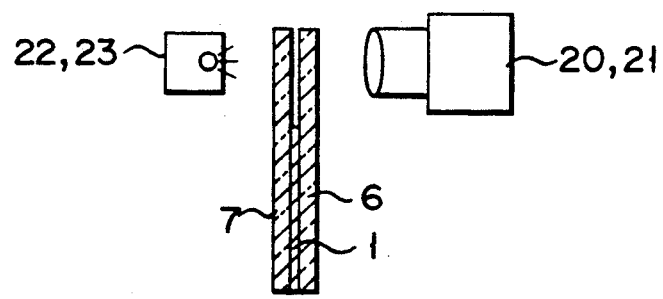
FIG. 7 shows a photographing means employed by the apparatus shown in FIG. 6.
Figure 8:
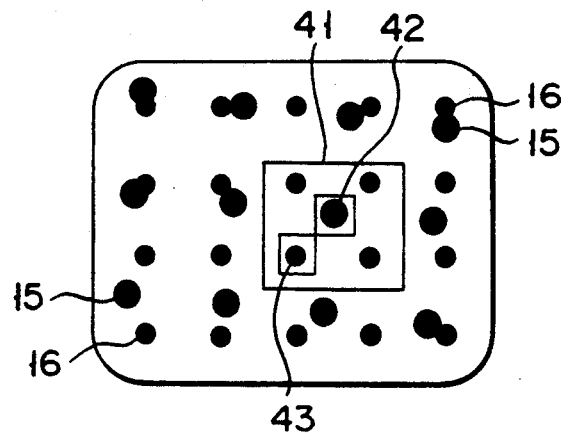
FIG. 8 shows an example of the alignment pattern employed by the method of the present invention.
Figure 9:
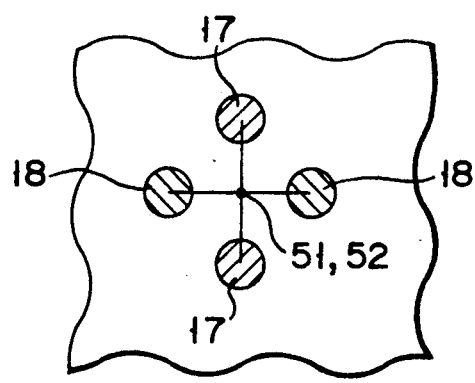
FIG. 9 shows another example of the alignment pattern employed by the method of the present invention.

Alignment patterns 15 and 16 shown in FIG. 8 or those 17 and 18 shown in FIG. 9 are drawn or bonded at those areas on the glass mask plates 6 and 7 which are not contacted with the iron plate 1 to oppose to each other. As shown in FIG. 7, CCD cameras 20 and 21 are arranged outside the glass mask plate 6 and illuminating light sources 22 and 23 are arranged outside the other glass mask plate 7, sandwiching the alignment patterns on both inner faces of the glass mask plates 6 and 7 between them. Image signal is applied from the CCD cameras 20 and 21 to an arithmetic unit 24.

Misregistration correcting mechanisms 28 and 29 which are driven by motors 26 and 27 are attached to the underside of the frame 11 in which the glass mask plate 6 is held, and a misregistration correcting mechanism 31 which is driven by a motor 30 is attached to one side of the frame 11. The frame 11 can be moved up and down and right and left by these misregistration correcting mechanisms 28, 29 and 31, which can be controlled by the arithmetic unit 24.

Correction amount measuring mechanisms 34 and 35 are attached to the top of the frame 11, opposing to the misregistration correcting mechanisms 28 and 29, and a correction amount measuring mechanism 36 is attached to the side of the frame 11, opposing to the misregistration correcting mechanism 31. The movement amount of the frame 11 practically moved by the misregistration correcting mechanisms 28, 29 and 31 can be measured by the correction amount measuring mechanisms 34, 35 and 36 which are opposed to the misregistration correcting mechanisms 28, 29 and 31. Results measured by these correction amount measuring mechanisms 34, 35 and 36 are applied to the arithmetic unit 24.

The alignment patterns 15 and 16 shown in FIG. 8 or the alignment patterns 17 and 18 shown in FIG. 9 on the inner faces of the glass mask plates 6 and 7 are imagesensed by the CCD cameras 20 and 21 and the alignment pattern 15 and 17 misregistered relative to the other alignment pattern 16 or 18 is detected and the amount of the misregistration is calculated as will be described later. The movement amount of the frame 11 which is to be practically moved is measured by the correction amount measuring mechanisms 34, 35 and 36 according to the calculated value. The frame 11 is thus moved up and down as well as right and left by the misregistration correcting mechanisms 28, 29 and 31 to correct the positional shift of the aperture pattern 4 on the inner face of the glass mask plate 6 relative to the aperture pattern 5 on the inner face of the glass mask plate 7.

A clearance equal to the width of the iron plate 1 is formed between the glass mask plates 6 and 7. In order to simultaneously image-sense the alignment patterns 15 and 16 or 17 and 18, it is needed that each of the CCD cameras 20 and 21 includes an optical system having a depth of field larger than 0.25 mm.

The manner of calculating the amount of misregistration by means of the arithmetic unit 24 will be described.

The alignment patterns 15 and 16 comprise a plurality of black dots different in size and arranged at different pitches on the inner sides of the two glass mask plates 6 and 7. Namely, a plurality of black dots large in size are arranged at a large pitch on the inner side of the glass mask plate 6, while a plurality of black dots small in size are arranged at a small pitch on the inner side of the glass mask plate 7. When these alignment patterns 15 and 16 are used, it can be decided by the size of the black dots which of the two glass mask plates they belong to. In addition, a portion 41 where the large black dot is not overlapped by the small one and the distance between the large and the small dot is smaller than 1 mm necessarily exists between the alignment patterns 15 and 16. These make it easy to set the apparatus.

When it is assumed that the dimension of an image pickup element in each of the CCD cameras 20 and 21 is 6×8 mm, that optical magnification is set about 5 times, that a plurality of black dots each having a diameter of 100 μm are arranged at a pitch of 500 μm on the inner side of the glass mask plate 6, that a plurality of black dots each having a diameter of 60 μm are arranged at a pitch of 300 μm on the inner side of the glass mask plate 7, and that coordinates of the center on a line connecting centers of black dots 42 and 43 which are independent of the other and which are not overlapped each other are calculated on the base of $x = \Sigma x_n/\Sigma n$ and $y = \Sigma y_n/\Sigma n$, measurement can be achieved with an accuracy of about 1.4 μm. $x_n$ and $y_n$ represent coordinates in a case where a visual field image-sensed by the CCD cameras 20 and 21 is divided like a matrix and the image element of the matrix is black, n denotes 1 when the image element is similarly black, and $\Sigma n$ denotes the total of n relating to the black image elements. When the alignment patterns 15 and 16 are used, it is observed by eyes as seen in the conventional case how the aperture pattern 4 on the inner side of the glass mask plate 6 is overlapped by the aperture pattern 5 on the inner side of the glass mask plate 7, the misregistration of the aperture pattern 4 relative to the aperture pattern 5 is corrected by moving one of the glass mask plates 6 and 7, and the positional shift of the black dot 42 relative to the black dot 43 is thereafter observed on the basis of positions of the black dots at the portion 41 between the alignment patters 15 and 16 which have been measured till then.

One 17 of the alignment patterns 17 and 18 shown in FIG. 9 comprises a pair of black dots arranged in the vertical direction on the inner side of one glass mask plate 6 and the other 18 comprises a pair of black dots arranged in the horizontal direction on the inner side of the other glass mask plate 7.

In the case of the method of using the alignment patterns 15 and 16 shown in FIG. 8, the aperture patterns 4, 5 and the alignment patterns 15, 16 cannot be set in a certain positional relation, but in the case of the method of using the alignment patterns 17 and 18 shown in FIG. 9, the aperture patterns 4, 5 and the alignment patterns 17, 18 can be set in a positional relation. When the alignment patterns 17 and 18 on the inner sides of the glass mask plates 6 and 7 are set in the certain positional relation, they can be automatically aligned with each other.

More concretely, when the diameter of each of the black dots of the alignment patterns 17 and 18 is set 50 μm and distances between the paired upper and lower black dots and between the paired right and left black dots of the alignment patterns 17 and 18 on the inner sides of the glass mask plates 6 and 7 are set about 300 μm, centers on those lines which connect the paired upper and lower black dots and the paired right and left black dots can be measured with an accuracy of about 1 to 1.5 μm.

When centers 51 and 52 on those lines which connect the paired upper and lower black dots and between the paired right and left black dots of the alignment patterns 17 and 18 are overlapped each other as shown in FIG. 9, the aperture patterns 4 and 5 on the inner sides of the glass mask plates 6 and 7 can be positioned with high accuracy.

As described above, the positional misregistration of the alignment pattern 15 or 17 relative to the alignment pattern 16 or 18 can be both detected, the amount of the alignment pattern 15 or 16 misregistered can be calculated, and the positional misregistration of the aperture pattern 4 on the inner side of the glass mask plate 6 relative to the aperture pattern 5 on the inner side of the glass mask plate 7 can be automatically corrected on the basis of the amount of misregistration thus calculated by means of the apparatus shown in FIG. 6. Practically, the exposing operation is repeated as shown by a flow chart in FIG. 10.

Figure 5:
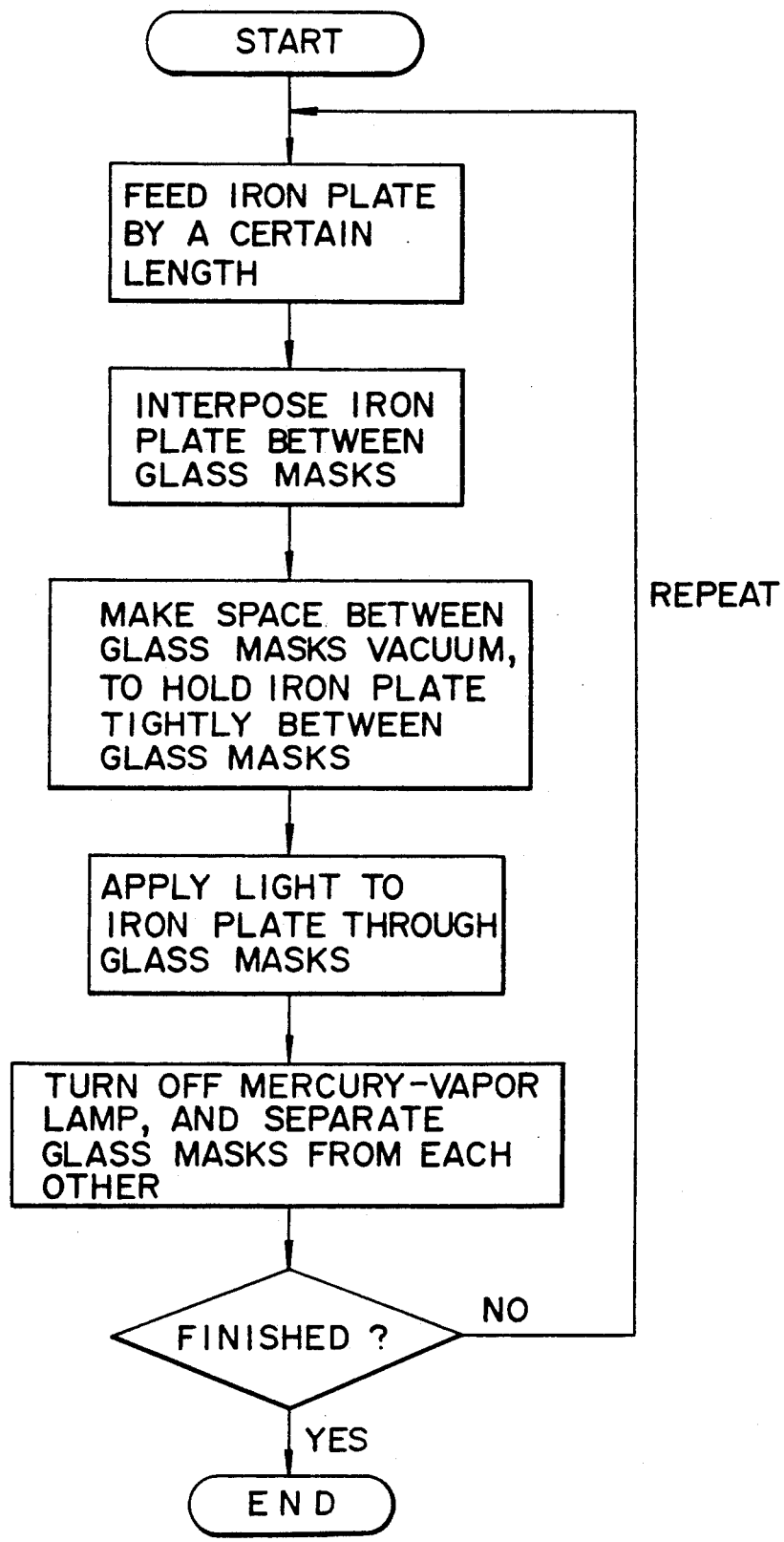
FIG. 5 is a flow chart showing the conventional exposing process.
Figure 10:
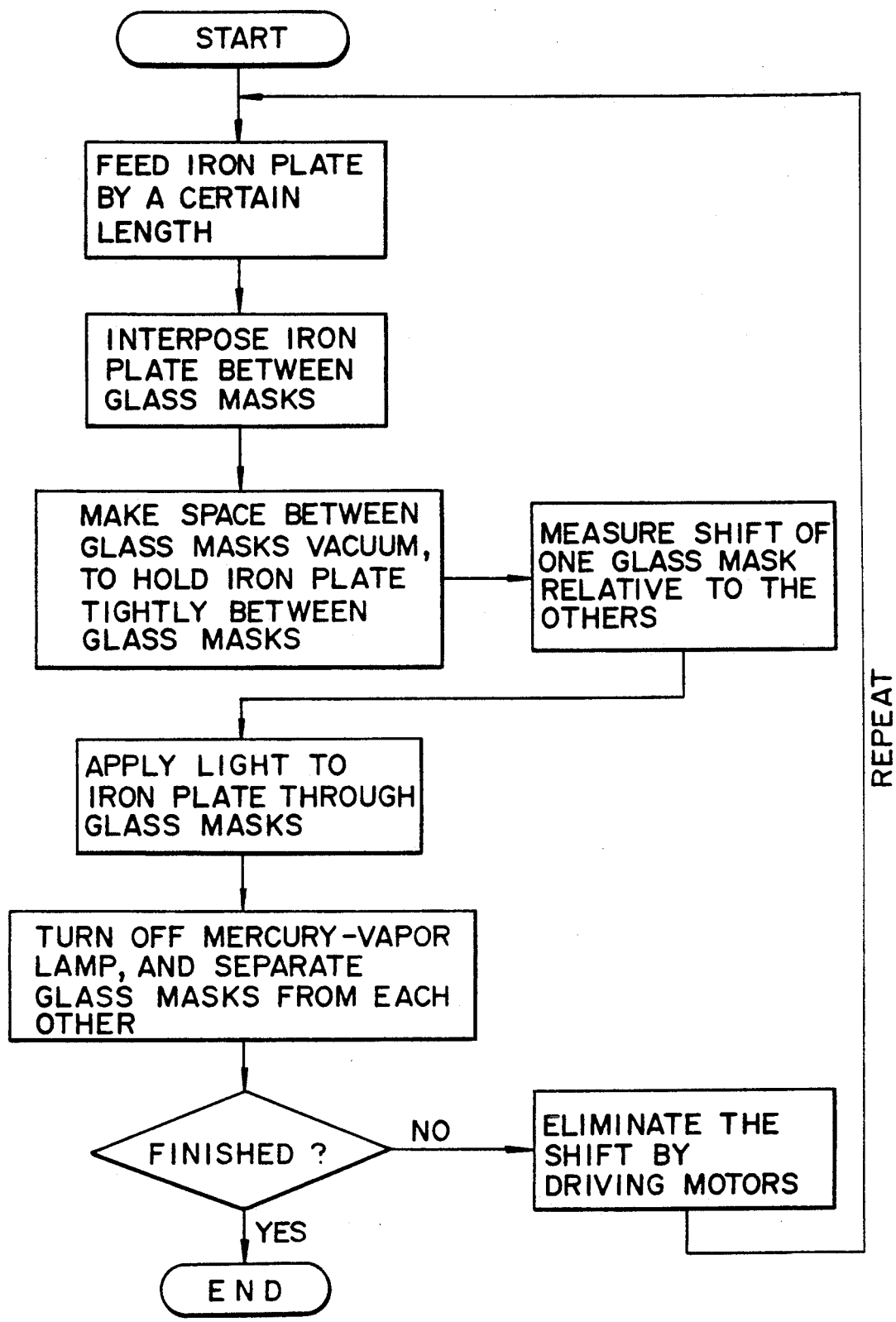
FIG. 10 is a flow chart showing the exposing process of the present invention.

The flow chart shown in FIG. 10 is different from the one shown in FIG. 5 in "misregistration measuring" and "misregistration correcting" steps. The reason why the "misregistration correcting" step is not carried out just after the "misregistration measuring" step in the flow chart shown in FIG. 10 is that when the "misregistration correcting" step is carried out at this point, the glass mask plates 6 and 7 rub against the iron plate 1 because they are closely contacted with the iron plate 1. When the positional misregistration is caused, therefore, the iron plate 1 is exposed from both sides thereof with the glass mask plates 6 and 7 positionally misregistered. Because the "misregistration measuring and correcting" steps are carried out every time the iron plate 1 is exposed, the positional misregistration of the glass mask plate 6 relative to the glass mask plate 7 does not become large and it can be therefore expected that the positional misregistration is in a range of allowable values.

The amount of the glass mask plate 6 positionally misregistered relative to the glass mask plate 7 usually reaches 10 to 15 μm because these plates 6 and 7 are thermally expanded by the irradiation of the mercuryvapor lamps, but according to the above-described method of the present invention, it can be kept smaller than 5 μm.

Figure 11:
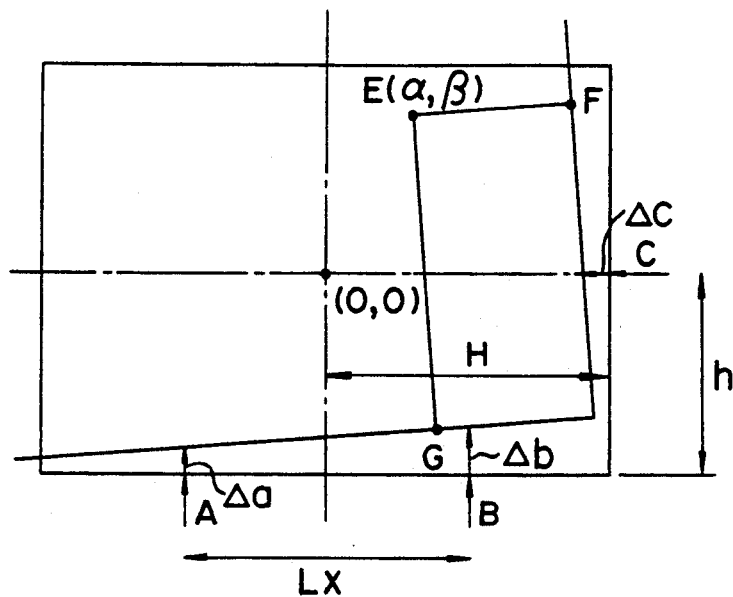
FIG. 11 is intended to explain a formula for correcting misregistration according to the method of the present invention.

FIG. 11 shows an example of the misregistration correcting step.

When it is assumed that movement amounts of the frame 11 moved at points A, B and C by the misregistration correcting mechanisms 28, 29 and 31 are $\Delta a$, $\Delta b$ and $\Delta c$ and its positionally misregistered amounts viewed at a point E through the CCD camera 21 and viewed at another point E' (not shown) through the CCD camera 20 are (ex, ey) and (ex', ey'), the following equations can be obtained:

$$ey + ey' = (\Delta a + \Delta b)(h + \beta) \qquad (1)$$

$$ey - ey' = 2\alpha/Lx(\Delta a - \Delta b)(h - \beta) \quad (2)$$

$$ex + ex' = 2H\{\beta/Lx(\Delta a - \Delta b) + \Delta c\} \quad (3)$$

$$ex - ex' = -2\alpha\{\beta/Lx(\Delta a - \Delta b) + \Delta c\} \quad (4)$$

Very small second-order terms are removed from these equations. It is assumed that the view points E and E' are positioned right and left and symmetrical to their center axis.

When the positional misregistration is measured in this manner, it may be corrected on the basis of the above-mentioned equations.

Although the positional misregistration is corrected after the exposing operation in the case of the above-described embodiment of the present invention, it may be arranged that the two glass mask plates are not shifted from each other again by fixing one of the glass mask plates which has been moved to correct the positional misregistration. This example of the exposing apparatus is shown in FIG. 12.

Figure 12:
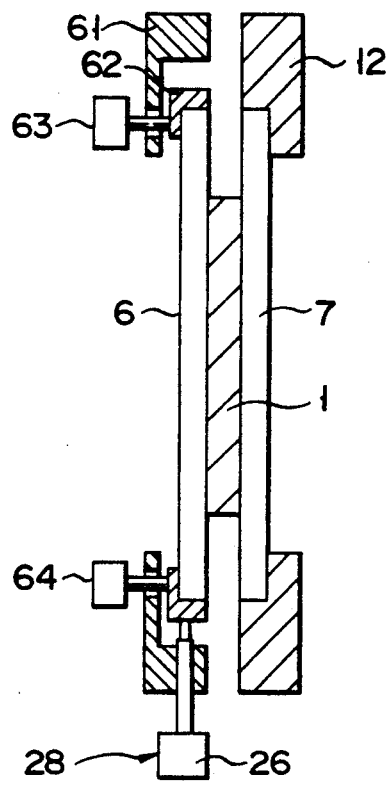
FIG. 12 is a sectional view showing a variation of the exposing apparatus according to the present invention.

In the case of the exposing apparatus shown in FIG. 12, the frame 11 for holding one glass mask plate 6 comprises a fixed frame 61 and an adjustable frame 62 movably attached to the fixed frame 61. Lock mechanisms 63 and 64 for the adjustable frame 62 are attached to the upper and lower beams of the fixed frame 61 with the two located at the upper beam and the other two at the lower beam, and the adjustable frame 62 is held by the glass mask plate 6 and moved by the misregistration correcting mechanisms 28, 29 and 31.

While releasing the adjustable frame 62 freely movable from the lock mechanisms 63 and 64, the adjustable frame 62 is moved by the misregistration correcting mechanisms 28, 29 and 31 to correct the positional misregistration, and the lock mechanisms 63 and 64 are then made operative by a cylinder to fix the adjustable frame 62 relative to the fixed frame 61. This enables the positional accuracy of the glass mask plate 6 to be kept just after the misregistration correcting step.

According to the present invention as described above, the amount of one of the two glass mask plates positionally misregistered relative to the other can be detected with high accuracy and this positional misregistration can be easily corrected in accordance with the positionally misregistered amount of the plate detected even when the exposed plate which has photosensitive material coated on both sides thereof and which is to be exposed from both sides thereof is sandwiched between the two glass mask plates.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

What is claimed is:

1. A method of exposing a long iron plate from both sides thereof, wherein said iron plate has a photosensitive material coated on both sides thereof, is held between a first mask plate provided with a first masking pattern on the inner side thereof and a second mask plate provided with a second masking pattern on the inner side thereof, comprising the steps of:

simultaneously image-sensing first and second alignment patterns formed at those areas on the inner sides of the first and second mask plates, respectively where the iron plate is not held by the first and second mask plates so as to obtain an image signal said first and second alignment patterns being in a predetermined positional relation when the first and second mask plates are correctly aligned with each other, said first alignment pattern comprising a pair of circular marks arranged in a direction parallel to the long axis of the iron plate and said second alignment pattern comprising a pair of circular marks arranged in the the a direction perpendicular to the long axis of the iron plate;

processing the image signal to determine the positionally mis-registered amount of the first and second alignment patterns from the predetermined positional relation;

exposing both sides of the iron plate to photoradiation through the first and second mask plates;

moving one of the first and second mask plates in a direction along the iron plate to correct the positionally mis-registered amount of the alignment pattern determined by the processing of the image signal;

moving the iron plate by a certain length; and repeating the previous steps.

2. The exposing method according to claim 1, wherein said first and second alignment patterns comprise a plurality of circular marks on the inner sides of the first and second mask plates, the circular marks of the first alignment pattern are different in size and pitch from those of the second alignment pattern, and those circular marks of the first and second alignment patterns which are separated from each other by a predetermined distance are image-sensed.

3. The exposing method according to claim 1, wherein after the iron plate is held between the first and the second mask plates, a vacuum is made in the space between the first and the second mask plate in order to closely contact the first and second mask plates with the iron plate, and the image-sensing step is then carried out.

4. The exposing method according to claim 1, wherein one of the first and second mask plates is moved while keeping this moving mask plate separated from the iron plate.

* * * * *